United States Patent
Bae et al.

(10) Patent No.: US 12,131,958 B2
(45) Date of Patent: Oct. 29, 2024

(54) SENSOR MOUNTED WAFER

(71) Applicant: E-TRON CO., LTD., Seoul (KR)

(72) Inventors: Jeong Woon Bae, Suwon-si (KR); Ho Seung Jeon, Uijeongbu-si (KR); Jung Sub Song, Ansan-si (KR)

(73) Assignee: E-TRON CO., LTD., Seoul (KR)

( * ) Notice: Subject to any disclaimer, the term of this patent is extended or adjusted under 35 U.S.C. 154(b) by 885 days.

(21) Appl. No.: 17/255,441

(22) PCT Filed: Nov. 5, 2020

(86) PCT No.: PCT/KR2020/015383
§ 371 (c)(1),
(2) Date: Dec. 23, 2020

(87) PCT Pub. No.: WO2021/091249
PCT Pub. Date: May 14, 2021

(65) Prior Publication Data
US 2021/0375699 A1 Dec. 2, 2021

(30) Foreign Application Priority Data
Nov. 5, 2019 (KR) .................. 10-2019-0140003

(51) Int. Cl.
*H01L 21/66* (2006.01)
*H01J 37/32* (2006.01)

(52) U.S. Cl.
CPC ........ *H01L 22/12* (2013.01); *H01J 37/32935* (2013.01); *H01L 22/14* (2013.01); *H01L 22/34* (2013.01)

(58) Field of Classification Search
CPC ......... H01L 22/12; H01L 22/14; H01L 22/34; H01L 21/50; H01L 21/67; H01J 37/32935; H01J 37/32; H01J 37/32082; G01R 33/007
See application file for complete search history.

(56) References Cited

U.S. PATENT DOCUMENTS

| | | | | |
|---|---|---|---|---|
| 9,165,793 B1* | 10/2015 | Wang | ............... | H01L 25/105 |
| 2004/0225462 A1* | 11/2004 | Renken | ............... | H01L 21/6732 702/94 |
| 2012/0255357 A1* | 10/2012 | Chen | ............... | G01P 15/008 73/514.31 |
| 2013/0134300 A1* | 5/2013 | Kamamori | .......... | H01L 31/0203 156/219 |

(Continued)

FOREIGN PATENT DOCUMENTS

| KR | 20170072252 A | 6/2017 |
|---|---|---|
| KR | 101847627 B1 | 4/2018 |

(Continued)

*Primary Examiner* — Ratisha Mehta
(74) *Attorney, Agent, or Firm* — Bayramoglu Law Offices LLC

(57) ABSTRACT

A sensor mounted wafer includes a lower case, a circuit board, a metal layer, an upper case and lower case. A mounting groove is formed on a surface of the lower case. An electronic component is mounted on the circuit board, and placed in the mounting groove. The upper case having an insertion groove on a surface of the upper case, wherein the electronic component is inserted into the insertion groove, and the upper case is bonded together to the lower case. The metal layer placed on at least one surface of the lower case and the upper case.

9 Claims, 27 Drawing Sheets

(56) References Cited

U.S. PATENT DOCUMENTS

| | | | | |
|---|---|---|---|---|
| 2016/0122179 | A1* | 5/2016 | Kim | B81C 1/0023 |
| | | | | 438/54 |
| 2018/0090525 | A1* | 3/2018 | Barker | H01L 31/108 |
| 2019/0062156 | A1* | 2/2019 | Lee | B81B 7/02 |
| 2019/0154511 | A1* | 5/2019 | Van Buggenhout | G01J 5/026 |
| 2019/0310183 | A1* | 10/2019 | Lee | G01K 11/265 |

FOREIGN PATENT DOCUMENTS

| | | |
|---|---|---|
| KR | 20190011617 A | 2/2019 |
| KR | 101991644 B1 | 9/2019 |
| KR | 102039985 B1 | 11/2019 |

* cited by examiner

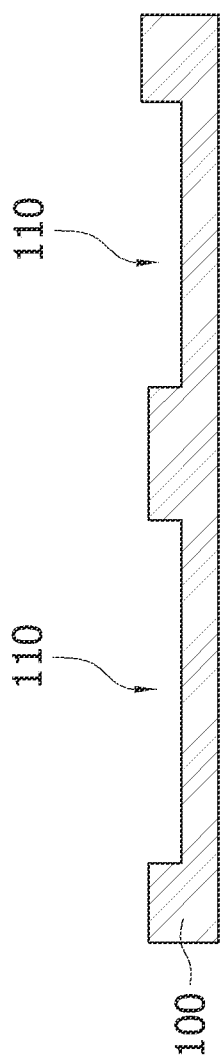

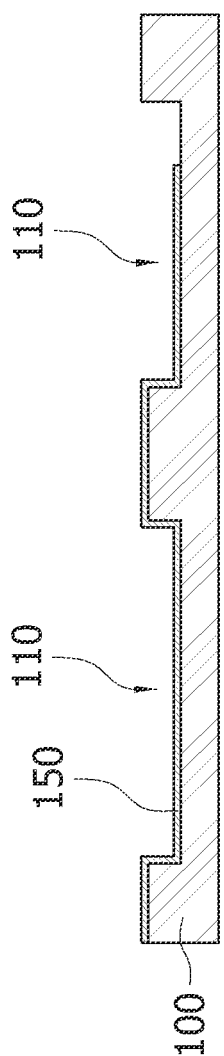

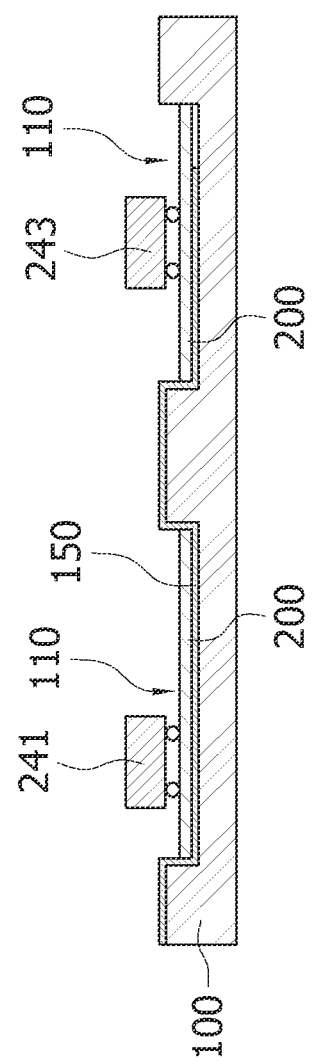

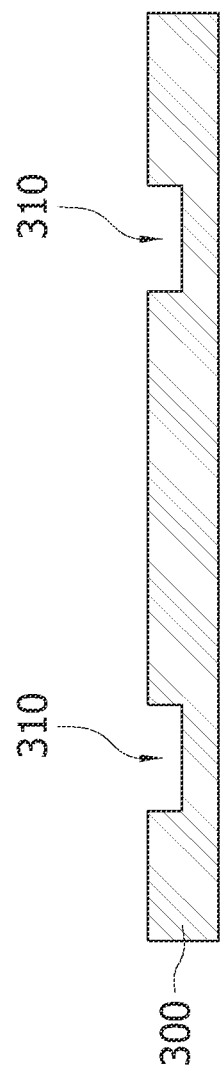

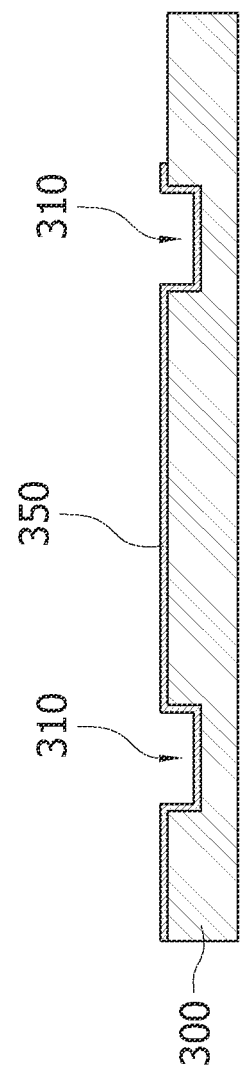

240 : 241,243

SENSOR MOUNTED WAFER

CROSS REFERENCE TO RELATED APPLICATIONS

This application is the national stage entry of International Application No. PCT/KR2020/015383, filed on Nov. 5, 2020, which is based upon and claims priority to Korean Patent Application No. 10-2019-0140003, filed on Nov. 5, 2019, the entire contents of which are incorporated herein by reference.

TECHNICAL FIELD

The present invention relates to a sensor mounted wafer, and more particularly, to a sensor mounted wafer capable of sensing temperature or plasma.

BACKGROUND

In general, semiconductor manufacturing goes through a number of processes including optical, deposition, growth, and etching processes.

Semiconductor manufacturing processes require careful monitoring of process conditions and equipment operating conditions in each process. For example, precise monitoring is essential for optimal semiconductor yield while controlling the temperature, gas injection state, pressure state, plasma density or exposure distance of a chamber or wafer.

If an error occurs in the process conditions related to temperature, plasma, pressure, flow rate and gas, or if the equipment malfunctions, many defects occur, which is fatal to the overall yield.

Meanwhile, in the conventional art, the process conditions in the chamber were indirectly measured in semiconductor manufacturing, but research has been developed to directly measure the internal conditions of the chamber or the state of the wafers loaded in the chamber in order to improve the semiconductor yield. One of them is SOW (Sensor On Wafer) which is developed as a wafer temperature sensing technology.

SOW (Sensor On Wafer) is a technology in which a temperature sensor or a plasma sensor is mounted on a test wafer, and the temperature or plasma in a semiconductor manufacturing process is directly sensed in a chamber using the temperature sensor or plasma sensor. In such SOW (Sensor On Wafer), there is a need for a technology capable of more precisely sensing temperature or plasma.

The above information disclosed in this Background section is only for enhancement of understanding of the background of the invention and it may therefore contain information that does not form the prior art that is already known to a person of ordinary skill in the art.

SUMMARY

The present invention is directed to providing a sensor mounted wafer capable of precisely sensing the temperature inside a chamber in which the sensor mounted wafer is loaded or the temperature of the sensor mounted wafer loaded in the chamber.

In addition, the present invention is directed to providing a sensor mounted wafer capable of preventing sensor mounted wafer warpage phenomenon caused by temperature rise.

In addition, the present invention is directed to providing a sensor mounted wafer capable of not only significantly lowering the damage rate of a product, but also improving product quality.

In addition, the present invention is directed to providing a sensor mounted wafer capable of easily forming an edge mounting groove and an edge insertion groove at a position relatively close to edges of a lower case and an upper case.

In addition, the present invention is directed to providing a sensor mounted wafer capable of allowing a plasma sensor to accurately sense the density and uniformity of plasma and preventing malfunction of an electronic component.

The technical problems to be achieved in the present invention are not limited to the technical problems mentioned above, and other technical problems not mentioned will be clearly understood by those of ordinary skill in the art from the following description.

The present invention provides a sensor mounted wafer, including: a lower case having a mounting groove formed on one surface thereof; a circuit board on which an electronic component is mounted, and placed in the mounting groove; an upper case having an insertion groove, into which the electronic component is inserted, on one surface thereof and bonded together to the lower case; and a metal layer placed on at least one surface of the lower case and the upper case.

Here, the metal layer may include a first metal layer placed between the lower case and the circuit board and a second metal layer placed between the circuit board and the upper case.

In addition, the sensor mounted wafer according to an embodiment of the present invention may further include an adhesive layer including a thermally conductive material and placed inside the mounting groove and the insertion groove.

In addition, the electronical component may include at least one of an integrated circuit (IC) chip and a battery.

In addition, the adhesive layer may have a thermal expansion coefficient smaller than or the same as those of the lower case and the upper case.

In addition, the adhesive layer may be placed in a shape to surround the electronic component.

In addition, lower portion of the electronic component may be located inside the mounting groove and upper portion of the electronic component may be located inside the insertion groove.

In addition, the mounting groove may be formed in a shape corresponding to the circuit board and the insertion groove may be formed in a shape corresponding to the electronic component.

In addition, the circuit board may include an antenna board having a concentric circle shape and a plurality of sensor boards extending from an outer circle of the antenna board to the outside and arranged radially.

In addition, a charging antenna may be provided in a coil shape on an inner circle of the antenna board, a communication antenna may be provided in a coil shape on an outer circle of the antenna board, and a plurality of sensors may be provided on the sensor board.

In addition, the metal layer may be placed on a region other than a region where the antenna board is placed.

In addition, the circuit board may further include a control board placed on a region where the sensor board extends from the antenna board.

In addition, the control board may include at least one of a control integrated circuit (IC) chip, a communication IC chip, a charging IC chip, and a memory.

In addition, the mounting groove may be formed corresponding to the plurality of sensor boards at a regular distance so that it is formed to deviate from a crystal direction of the lower case or the upper case by a set angle.

In addition, the set angle may have a constant value regardless of the number of sensor boards, and in particular, it is preferable to be 11.25°.

In addition, the present invention provides a sensor mounted wafer, including: a lower case in which a main mounting groove and an edge mounting groove extending outward from the main mounting groove are formed respectively; a circuit board on which an electronic component is mounted, and placed in the main mounting groove and the edge mounting groove; an upper case in which a main insertion groove and an edge insertion groove respectively face the main mounting groove and the edge mounting groove, and bonded together to the lower case so that the electronic component is inserted into the main insertion groove and the edge insertion groove; and an adhesive layer placed between the lower case and the upper case.

Here, a distance between the edge mounting groove and the edge of the lower case may be less than or equal to a first set length, and a distance between the edge insertion groove and the edge of the upper case may be less than or equal to a second set length.

In addition, the present invention provides a sensor mounted wafer, including: a lower case having a mounting groove formed on one surface thereof; a circuit board on which an plasma sensor and an electronic component are mounted, and mounted in the mounting groove; an upper case having an insertion groove, into which the plasma sensor and the electronic component are inserted, on one surface thereof and bonded together to the lower case; and a conductive pattern placed on the bonding surface of the lower case and the upper case to form an equipotential surface between the lower case and the upper case.

Here, the conductive pattern may be placed around at least one of the plasma sensor and the electronic component, and may be made of silver dots.

An aspect of the present invention may effectively disperse heats by placing metal layers inside the sensor mounted wafer, thereby effectively reducing a temperature deviation of each sensor for each location, which allows to precisely sense the temperature inside the chamber or the temperature of the sensor mounted wafer loaded in the chamber for each location.

In addition, an aspect of the present invention may protect the electronic component, since the metal layers surround the electronic component thereby shielding electromagnetic interference (EMI).

In addition, an aspect of the present invention may prevent communication disturbance or charging disturbance caused by metal layers made of metal material by not placing the metal layers on a region where the antenna board is placed.

In addition, an aspect of the present invention may precisely sense the temperature inside the chamber in which the sensor mounted wafer is loaded or the temperature of the sensor mounted wafer loaded in the chamber by placing the adhesive layer having a relatively high thermal conductivity in a shape to surround the sensor.

In addition, an aspect of the present invention may prevent sensor mounted wafer warpage phenomenon caused by pore expansion due to temperature rise by placing the adhesive layer so that pores are not included inside the mounting groove and the insertion groove of the sensor mounted wafer into which the sensor is accommodated.

In addition, an aspect of the present invention may prevent sensor mounted wafer warpage phenomenon caused by expansion of the first adhesive layer due to temperature rise by placing the adhesive layer having a relatively low thermal expansion coefficient inside the mounting groove and the insertion groove of the sensor mounted wafer into which the sensor is accommodated.

In addition, an aspect of the present invention may not only significantly lower the damage rate of a product, but also improve product quality by forming the mounting groove and the insertion groove to deviate from a crystal direction of the lower case or the upper case by a set angle.

In addition, an aspect of the present invention may easily form the edge mounting groove and the edge insertion groove at a position relatively close to edges of the lower case and the upper case.

In addition, an aspect of the present invention may form the edge mounting groove and the edge insertion groove relatively close to the edges of the lower case and the upper case, and may include sensors inside the edge mounting groove and the edge insertion groove, thereby capable of sensing relatively accurately the temperature or pressure of the edge region of the sensor mounted wafer.

In addition, an aspect of the present invention may place the conductive pattern on the bonding surface of the lower case and the upper case to form an equipotential surface between the lower case and the upper case, thereby allowing the plasma sensor to accurately sense the density and uniformity of the plasma and preventing malfunction of the electronic component.

The effects of the present invention are not limited to those mentioned above, and other effects not mentioned will be clearly understood by those of ordinary skill in the art from the following description.

BRIEF DESCRIPTION OF THE DRAWINGS

The above and other aspects, features, and advantages of the present disclosure will become more apparent to those of ordinary skill in the art by describing embodiments thereof in detail with reference to the accompanying drawings, in which:

FIGS. 7A to 7J are sequence diagrams of a method of manufacturing the sensor mounted wafer according to the first embodiment of the present invention;

DETAILED DESCRIPTION OF THE EMBODIMENTS

Figure 1:
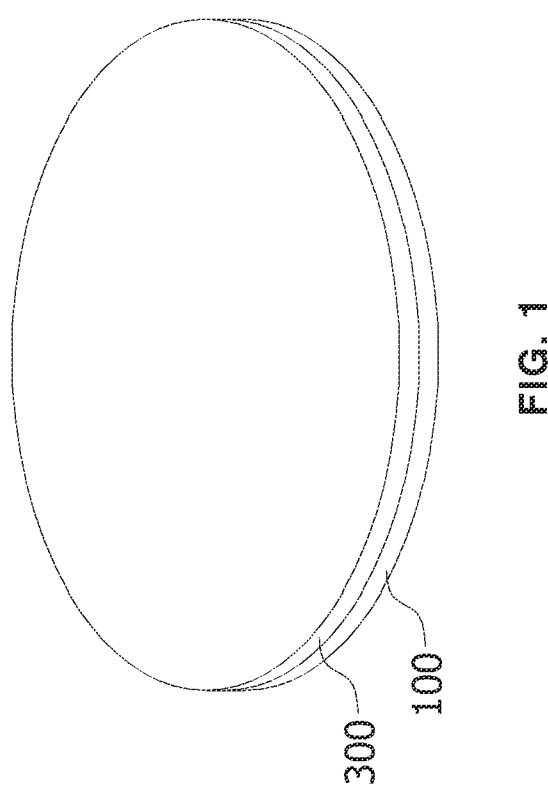
FIG. 1 is a perspective view of a sensor mounted wafer according to a first embodiment of the present invention.

Hereinafter, the embodiments of the present invention are described in detail with reference to the accompanying drawings. The detailed description to be disclosed hereinafter with the accompanying drawings is intended to describe exemplary embodiments of the present invention and is not intended to represent the only embodiments in which the present invention may be implemented. In the drawings, parts unrelated to the description may be omitted for clarity of description of the present invention, and like reference numerals may designate like elements throughout the specification.

In an embodiment of the present invention, expressions such as "or" and "at least one" may represent one of words listed together or a combination of two or more. For example, "A or B" and "at least one of A and B" may include only one of A or B, or may also include both A and B.

Figure 2:
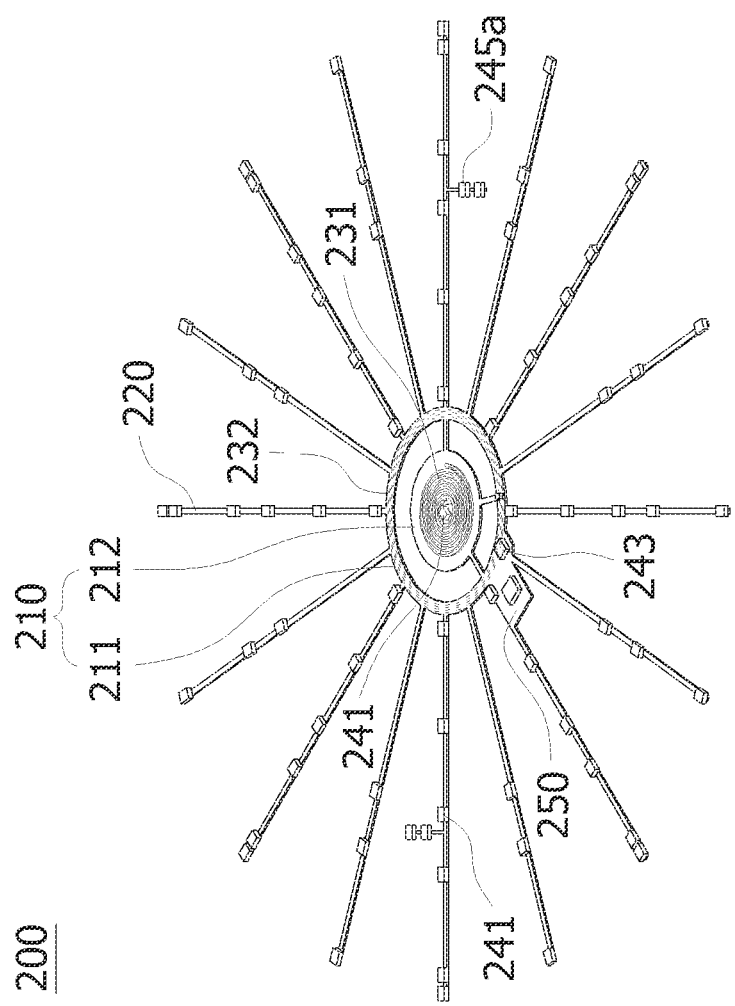
FIG. 2 is a perspective view of a circuit board included in the sensor mounted wafer according to the first embodiment of the present invention.

FIG. 1 is a perspective view of a sensor mounted wafer according to a first embodiment of the present invention; and FIG. 2 is a perspective view of a circuit board included in the sensor mounted wafer according to the first embodiment of the present invention.

Referring to FIGS. 1 and 2, the sensor mounted wafer according to the first embodiment of the present invention may include a lower case 100, a circuit board 200, and an upper case 300.

The lower case 100 and the upper case 300 may be formed in a disk shape, and may be made of the same material. In particular, the lower case 100 and the upper case 300 may include materials with excellent electrical characteristics including silicon (Si) and gallium arsenide (GaAs).

The circuit board 200 mounts an electronic component 240 and is placed between the lower case 100 and the upper case 300. Further, the circuit board 200 may include an antenna board 210, a sensor board 220 and a control board 250. Here, the electronic component 240 is a component of an electronic circuit, and may include at least one of a sensor 241, an integrated circuit (IC) chip 243, and a battery (not shown).

In addition, although not shown in the drawings, the circuit board 200 is a printed circuit board (PCB) with wiring printed thereon so that the sensor 241, the IC chip 243, and the battery (not shown) are electrically connected.

The antenna board 210 may be provided in concentric shape in the center of the circuit board 200. As such, a charging antenna 231 may be equipped on an inner circle 212 of the antenna board 210 and a communication antenna 232 may be equipped on an outer circle 211 of the antenna board 210. In addition, the charging antenna 231 and the communication antenna 232 may be formed in a printed form on the antenna board 210.

The sensor board 220 may be provided in plural, extend outward from the outer circle 211 of the antenna board 210, and be arranged radially. In addition, the sensor board 220 may include a plurality of sensors 241.

Here, the plurality of sensors 241 are embedded in a predetermined sensing position of the sensor mounted wafer to perform sensing for monitoring semiconductor process at the corresponding position. Specifically, the sensors 241 may be placed from one end (a point connected to the antenna board 210) of the sensor board 220 to the other end at a predetermined interval.

In contrast, as shown in FIG. 2, when the sensor board 220 is divided into one end part, the other end part, and the center part, a first sensor board having sensors 241 on the one end part, the other end part, and the center part, and a second sensor board having sensors 241 on the center part and the other end part, except for the one end part may be alternately arranged. In this way, an even number of sensor boards 220 may be provided to alternately arrange the first and second sensor boards.

In addition, the sensor 241 may be additionally provided at the center of the circuit board 200 to sense the temperature at the center of the sensor mounted wafer.

In addition, the sensor 241 may include a temperature sensor and a pressure sensor, and may sense various semiconductor process environments. For example, the sensor 241 may sense a state (temperature, pressure, gas, etc.) within a chamber in which the sensor mounted wafer is loaded, or a state (temperature, etc.) of the sensor mounted wafer loaded in the chamber.

Because when the control board 250 is placed in the center of the sensor mounted wafer in which the antenna board 210 is placed it may cause communication disturbance or charging disturbance, it is preferable that the sensor board 220 is placed on a region extending from the antenna board 210 rather than on the center of the sensor mounted wafer.

As such, the control board 250 may include a plurality of integrated circuit (IC) chips 243. Here, the plurality of IC chips 243 may be a control IC chip, a communication IC chip, a charging IC chip, and a memory.

The communication IC chip, which has a configuration for wireless communication with the outside, wirelessly transmits sensing information sensed by the sensor 241, and wirelessly receives control information for controlling the operation of the sensor 241.

Here, the control information may include a process in which the sensor mounted wafer is to be used, and conditions required for the process. For example, the control information may define a process for which the sensor mounted wafer is used, and may include set values for a sensing temperature, a sensing time, and a sensing method used in the defined process.

The control IC chip may control the operation of the sensor 241 using the control information. That is, the control IC chip may control the sensor 241 to operate based on the set values included in the control information.

The communication IC chip is connected to the communication antenna 232 to perform wireless communication with the outside. Here, the communication antenna 232 may be formed in a coil shape of a spiral loop and may be formed in a ring shape at the center of the circuit board 200, but is not limited thereto.

The sensor board 220 may include a battery terminal 245a on which a battery (not shown) is mounted. Here, the battery (not shown) supplies power for driving components including the sensor 241 and the IC chip 243 included in the sensor mounted wafer.

The charging IC chip performs wireless charging for the battery (not shown), and is connected to the charging antenna 231 for wireless charging. Here, the charging antenna 231 may be formed in a coil shape of a spiral loop and may be formed in a circular shape at the center of the circuit board 200, but is not limited thereto.

The memory may store control information for controlling the operation of the sensor 241 and may store sensing information sensed by the sensor 241. Further, the memory may store log data recording a process in which the sensor mounted wafer is used.

Here, the log data may include information on in which process and under which conditions the sensor mounted wafer was used.

Figure 3:
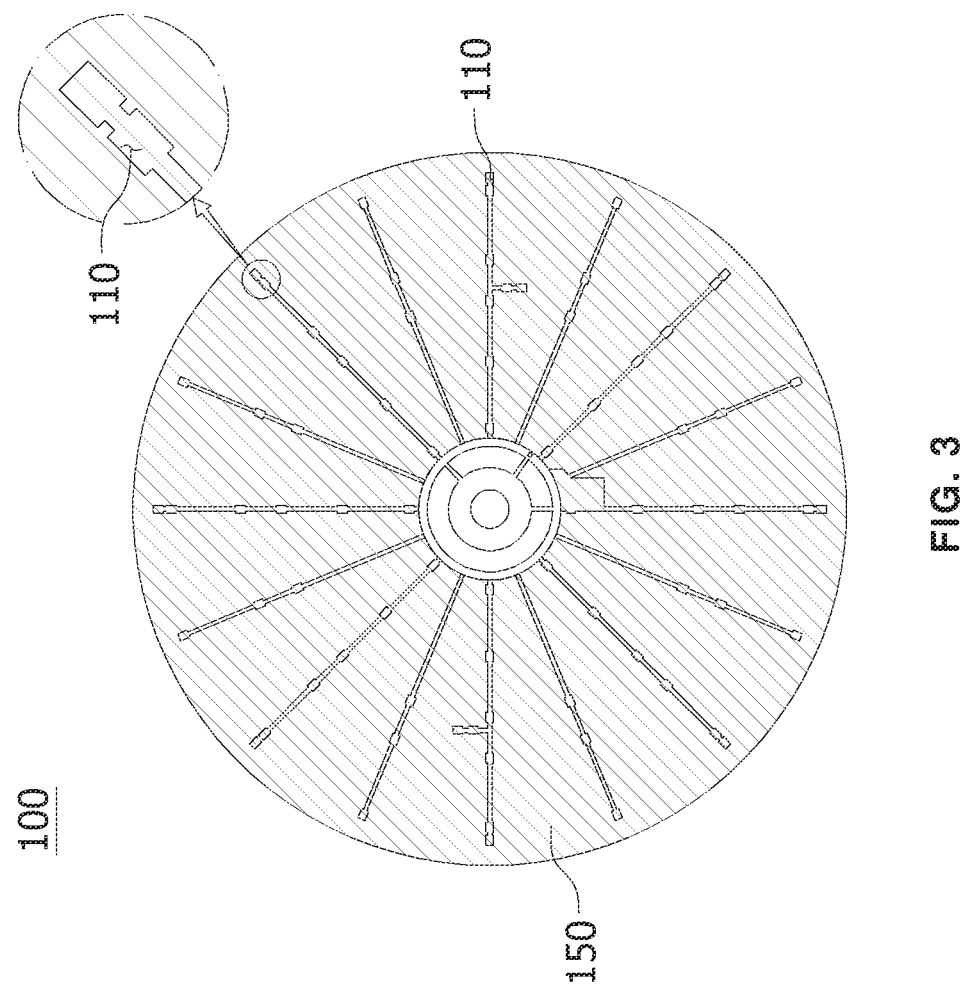
FIG. 3 is a top plan view of a lower case of the sensor mounted wafer according to the first embodiment of the present invention.
Figure 4:
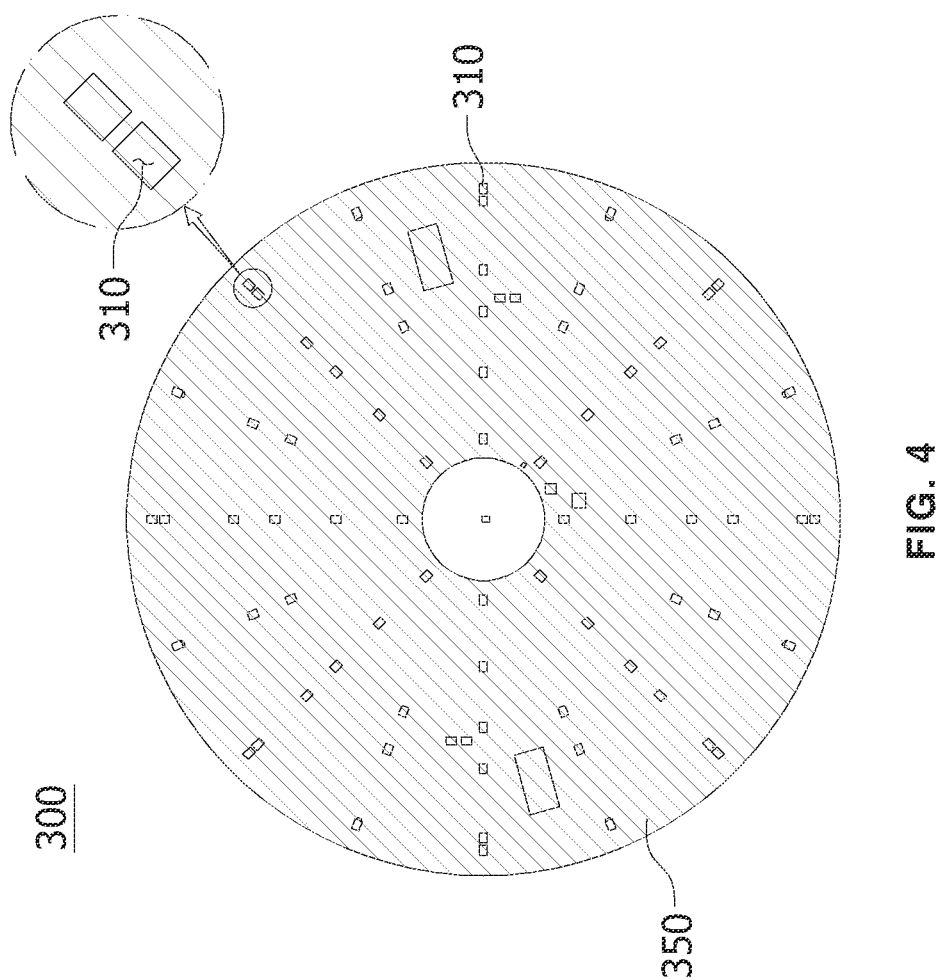
FIG. 4 is a top plan view of an upper case of the sensor mounted wafer according to the first embodiment of the present invention.

FIG. 3 is a top plan view of a lower case of the sensor mounted wafer according to the first embodiment of the present invention; FIG. 4 is a top plan view of an upper case of the sensor mounted wafer according to the first embodiment of the present invention; and FIG. 5 is a view illustrating a circuit board mounted on the lower case of FIG. 3.

Referring to FIGS. 3 and 4, a metal layer 150 and 350 is shown to be placed on one surface of the lower case 100 and the upper case 300, respectively, but the present invention is not limited thereto; and it is sufficient if it is placed on at least one surface of the lower case 100 and the upper case 300.

Figure 5:
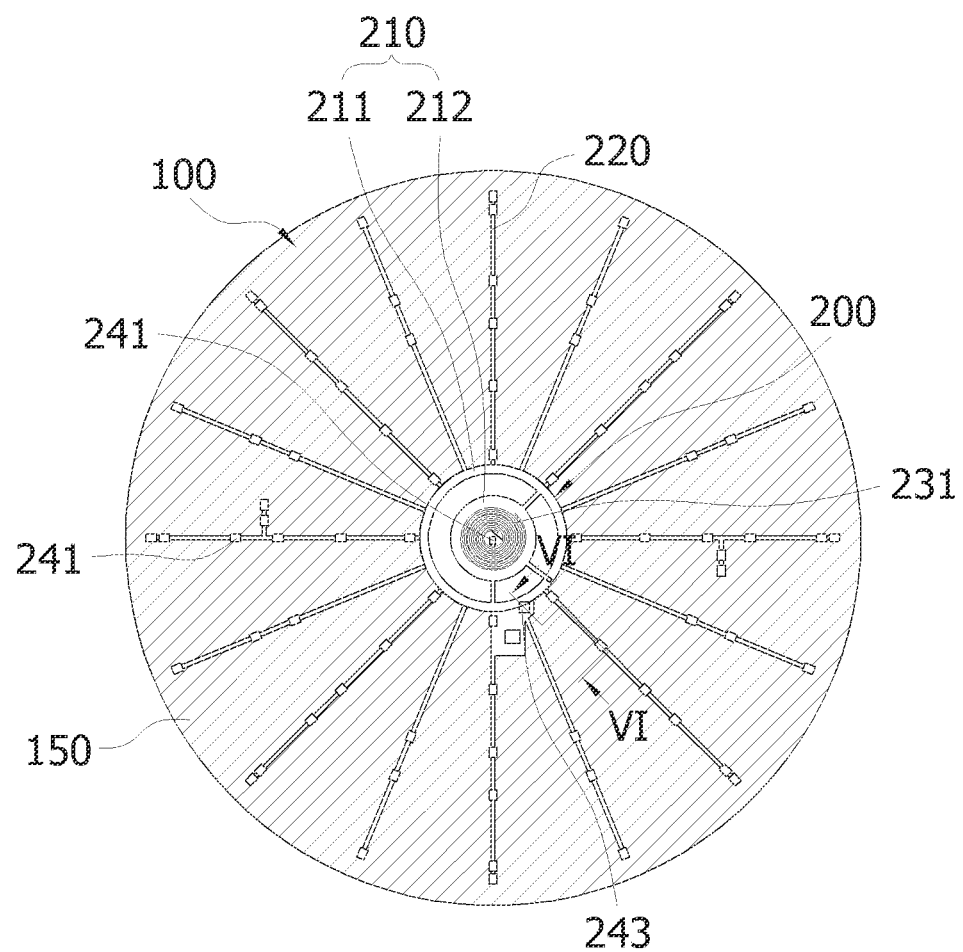
FIG. 5 is a view illustrating a circuit board mounted on the lower case of FIG. 3.

Referring to FIGS. 3 and 5, on one surface of the lower case 100, a mounting groove 110 in which the circuit board 200 is mounted is formed in a shape corresponding to the circuit board 200. Specifically, the mounting grooves 110 may be formed in a shape corresponding to the lower surface of the concentric antenna board 210, in a shape corresponding to the lower surface of the radial sensor board 220, and in a shape corresponding to the lower surface of the control board 250, respectively.

In addition, a first metal layer 150 is placed on one surface of the lower case 100 in which the mounting groove 110 is formed. Here, the first metal layer 150 may be made of a metal material having relatively excellent thermal conductivity, such as titanium (Ti) and copper (Cu), but is not limited thereto.

For example, the first metal layer 150 may be placed in a stacked structure of titanium (Ti), copper (Cu), and titanium (Ti), in which case the thickness of titanium (Ti) may be formed to 500 Å and the thickness of copper (Cu) may be formed to 10000 to 20000 Å.

As such, the first metal layer 150 may be placed on a region other than a region where the antenna board 210 is placed. That is, the first metal layer 150 may not be placed on a region where the antenna board 210 is mounted, but may be placed only on a remaining region including a region where the sensor board 220 and the control board 250 are mounted.

Referring to FIGS. 4 and 5, in the upper case 300, an insertion groove 310 into which the electronic component 240 is inserted is formed in a shape corresponding to the electronic component 240. Specifically, the insertion groove 310 may be formed in a shape corresponding to the upper surface of the electronic component 240 at a position where the electronic component 240 is mounted on the circuit board 200.

In addition, a second metal layer 350 is placed on one surface of the upper case 100 in which the insertion groove 310 is formed. Here, the second metal layer 350 may be made of a metal material having relatively excellent thermal conductivity, such as titanium (Ti) and copper (Cu), but is not limited thereto.

For example, the second metal layer 350 may be placed in a stacked structure of titanium (Ti), copper (Cu), and titanium (Ti), in which case the thickness of titanium (Ti) may be formed to 500 Å and the thickness of copper (Cu) may be formed to 10000 to 20000 Å.

The second metal layer 350 may be placed on a region other than a region where the antenna board 210 is placed. That is, the second metal layer 350 may be formed in a symmetrical shape with the first metal layer 150 when the lower case 100 and the upper case 300 are bonded together.

As described above, the sensor mounted wafer according to the first embodiment of the present invention may effectively disperse heats by respectively placing the first metal layer 150 and the second metal layer 350 on one surface on which the lower case 100 and the upper case 300 are bonded together, thereby effectively reducing a temperature deviation of each sensor 241 for each location, which allows to precisely sense the temperature inside the chamber or the temperature of the sensor mounted wafer loaded in the chamber for each location.

In addition, the sensor mounted wafer according to the first embodiment of the present invention may protect the electronic component 240, since the first and second metal layers 150 and 350 surround the electronic component 240 thereby shielding electromagnetic interference (EMI).

In addition, the sensor mounted wafer according to the first embodiment of the present invention may prevent communication disturbance or charging disturbance caused by the first and second metal layers 150 and 350 made of metal material by not placing the first and second metal layers 150 and 350 on a region where the antenna board 210 is placed.

The above-described mounting groove 110 and insertion groove 310 may be formed by a wet etching technique, but are not limited thereto. Further, the first and second metal layers 150 and 350 may be deposited on one surface of the lower case 100 and the upper case 300 by various deposition techniques.

Figure 6:
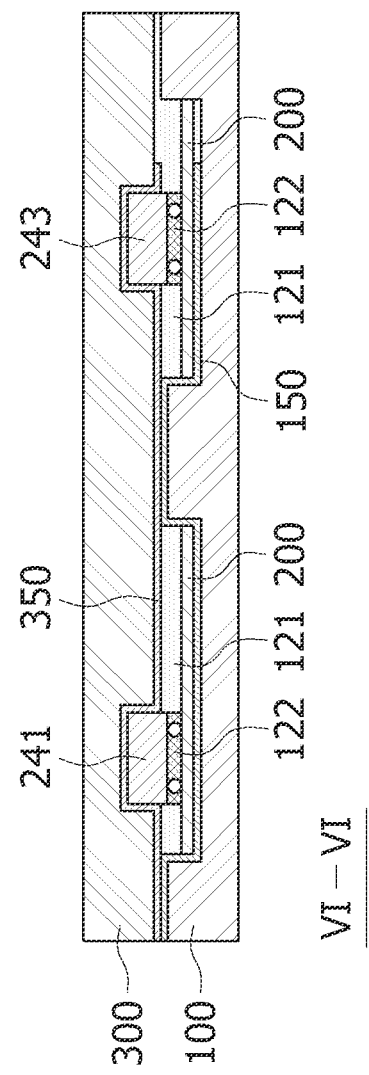
FIG. 6 is a cross-sectional view of the sensor mounted wafer according to the first embodiment of the present invention, taken along VI-VI line of FIG. 5.

FIG. 6 is a cross-sectional view of the sensor mounted wafer according to the first embodiment of the present invention, taken along VI-VI line of FIG. 5.

Referring to FIG. 6, the sensor mounted wafer according to the first embodiment of the present invention may include a lower case 100, a circuit board 200, an upper case 300, metal layers 150 and 350, and a first adhesive layer 121.

The metal layers 150 and 350 may be placed on at least one surface of the lower case 100 and the upper case 300. Hereinafter, am example in which the metal layers 150 and 350 are placed on one surface of the lower case 100 and the upper case 300 will be described.

As shown in FIG. 6, the metal layers 150 and 350 may include a first metal layer 150 placed between the lower case 100 and the circuit board 200 and a second metal layer 350 placed between the circuit board 200 and the upper case 300.

The lower case 100 has a mounting groove 110 formed on one surface thereof, and the first metal layer 150 is placed on one surface of the lower case 100 in which the mounting groove 110 is formed.

The circuit board 200 mounts an electronic component 240 such as a sensor 241 and an IC chip 243, and is placed on top of the first metal layer 150 in the mounting groove 110. Here, the electronic component 240 may be soldered to wiring of the circuit board 200, and the circuit board 200 may be attached to the top of the first metal layer 150 in the mounting groove 110 of the lower case 100 by using an adhesive.

The upper case 300 has an insertion groove 310 into which the electronic component 240 is inserted, formed on one surface thereof, and the second metal layer 350 is placed on one surface of the upper case 300 in which the insertion groove 310 is formed.

Here, the upper case 300 is bonded to the lower case 100 so that the upper portion of the electronic component 240 is inserted into the insertion groove 310. Accordingly, the second metal layer 350 in the insertion groove 310 surrounds the upper portion of the electronic component 240, and the remaining boards 220 and 250 excluding the antenna board 210 are surrounded by the first and second metal layers 150 and 350.

As described above, the sensor mounted wafer according to the first embodiment of the present invention may effectively disperse heats by respectively placing the first metal layer 150 and the second metal layer 350 on one surface on which the lower case 100 and the upper case 300 are bonded together, thereby effectively reducing a temperature deviation of each sensor 241 for each location, which allows to precisely sense the temperature inside the chamber or the temperature of the sensor mounted wafer loaded in the chamber for each location.

In addition, the sensor mounted wafer according to the first embodiment of the present invention may prevent communication disturbance or charging disturbance caused by the first and second metal layers 150 and 350 made of metal material by not placing the first and second metal layers 150 and 350 on a region where the antenna board 210 is placed.

Meanwhile, due to the form of arrangement of the first metal layer 150 described above, there may be a gap between the lower case 100 and the circuit board 200, and a first adhesive layer 121 to be described later may be placed in this gap region. Meanwhile, due to the form of arrangement of the second metal layer 350 described above, there may be a gap between the lower case 100 and the upper case 300, and a first adhesive layer 121 to be described later may be placed in this gap region.

The first adhesive layer 121 is placed between the lower case 100 and the upper case 300, in particular, inside the mounting groove 110 and the insertion groove 310. Here, the first adhesive layer 121 may be made of a Si-based material having a hardness of shore A40 or less and an elongation of 30% or more.

When the lower case 100 and the upper case 300 are bonded together, the first adhesive layer 121 is completely filled in the mounting groove 110 and the insertion groove 310 and is placed to surround the electronic component 240 so that pores are not included inside the mounting groove 110 and the insertion groove 310 with the lower case 100 and the upper case 300 bonded together.

As described above, the sensor mounted wafer according to the first embodiment of the present invention may prevent the sensor mounted wafer warpage phenomenon caused by pore expansion due to temperature rise by placing the first adhesive layer 121 so that pores are not included inside the mounting groove 110 and the insertion groove 310.

In addition, the first adhesive layer 121 is characterized in that its thermal expansion coefficient is smaller than or the same as those of the lower case 100 and the upper case 300.

As described above, the sensor mounted wafer according to the first embodiment of the present invention may prevent the sensor mounted wafer warpage phenomenon caused by expansion of the first adhesive layer 121 due to temperature rise by placing the first adhesive layer 121 having a relatively low thermal expansion coefficient between the mounting groove 110 and the insertion groove 310.

The sensor mounted wafer according to the first embodiment of the present invention may further include a second adhesive layer 122 placed on a region where the electronic component 240 is mounted, that is, on a soldering region. Here, the soldering region includes an empty space between the circuit board 200 and the electronic component 240, and the second adhesive layer 122 formed by filling the empty space with an adhesive through an underfill process may prevent peeling of the electronic component 240 due to the sensor mounted wafer warpage phenomenon by performing a role of firmly fixing the electronic component 240 to the circuit board 200.

Here, the second adhesive layer 122 may be made of a contact epoxy material having a hardness of shore D50 or more and an elongation of 5% or less.

The sensor mounted wafer according to the first embodiment of the present invention is characterized in that the thermal conductivity of the first adhesive layer 121 is higher than that of the second adhesive layer 122. For example, the thermal conductivity of the first adhesive layer 121 may be 0.8 W/m*K or more. To this end, the first adhesive layer 121 may include a separate thermally conductive material, and the thermally conductive material may be a non-conductive material to prevent a short of the electronic component 240.

Specifically, the first adhesive layer 121 is placed in a shape completely filled in the mounting groove 110 and the insertion groove 310 to surround the sensor 241, and it is possible to precisely sense the temperature inside the chamber in which the sensor mounted wafer is loaded or the temperature of the sensor mounted wafer loaded in the chamber by placing the first adhesive layer 121 having a relatively high thermal conductivity in such a shape. On the other hand, the second adhesive layer 122 is not configured to precisely sense the temperature of the sensor 241 but is configured to perform a role of firmly fixing the electronic component 240 including the sensor 241 to the circuit board 200. So, it is okay even if the thermal conductivity of the second adhesive layer is relatively low.

Referring to FIG. 6, after the lower case 100 and the upper case 300 are bonded, the lower portion of the electronic component 240 may be located inside the mounting groove 110 of the lower case 100, and the upper portion of the electronic component 240 may be located inside the insertion groove 310 of the upper case 300.

On the other hand, unlike the drawings, the size of the insertion groove 310 of the upper case 300 may be formed larger than that of the electronic component 240, and the depth of the insertion groove 310 may be also formed so that the electronic component 240 does not contact the second metal layer 350 inside the insertion groove 310 during bonding of the lower case 100 and the upper case 300.

FIGS. 7A to 7J are sequence diagrams of a method of manufacturing the sensor mounted wafer according to the first embodiment of the present invention.

Hereinafter, a method of manufacturing the sensor mounted wafer according to the first embodiment of the present invention will be described with reference to FIGS. 1 to 7J, but the same contents as the above-described sensor mounted wafer according to the first embodiment of the present invention will be omitted.

First, referring to FIG. 2, a circuit board 200 including: an antenna board 210 having a concentric circle shape, a plurality of sensor boards 220 extending from an outer circle of the antenna board 210 to the outside and arranged radially, and a control board 250 placed on a region where the sensor board 220 extends from the antenna board 210 is generated.

Next, an electronic component 240 including at least one of a sensor 241, an integrated circuit (IC) chip 234, and a battery (not shown) is mounted on top of the circuit board 200. That is, the electronic component 240 is soldered to wiring of the circuit board 200.

Specifically, a coil-shaped charging antenna 231 is formed on an inner circle 212 of the antenna board 210; a coil-shaped communication antenna 232 is formed on an outer circle 211 of the antenna board 210; a plurality of sensors 241 are mounted on the plurality of sensor boards 220; and a plurality of IC chips 243 are mounted on the control board 250.

Next, as shown in FIG. 7A, a mounting groove 110 is formed in a shape corresponding to the circuit board 200 in a lower case 100. Here, the mounting groove 110 may be formed by a wet etching technique.

Next, as shown in FIG. 7B, a first metal layer 150 is formed on one surface of the lower case 100 in which the mounting groove 110 is formed. Here, the first metal layer 150 may be deposited on one surface of the lower case 100 by various deposition techniques.

In addition, the first metal layer 150 may be made of a metal material having relatively excellent thermal conductivity, such as titanium (Ti) and copper (Cu), but is not limited thereto.

For example, the first metal layer 150 may be placed in a stacked structure of titanium (Ti), copper (Cu), and titanium (Ti), in which case the thickness of titanium (Ti) may be formed to 500 Å and the thickness of copper (Cu) may be formed to 10000 to 20000 Å.

As such, the first metal layer 150 may be placed on a region other than a region where the antenna board 210 is placed.

Next, as shown in FIG. 7C, the circuit board 200 is mounted on the first metal layer 150 in the mounting groove 110 formed on one surface of the lower case 100. Here, the circuit board 200 may be attached to the upper part of the first metal layer 150 in the mounting groove 110 by an adhesive.

Figure 7D:
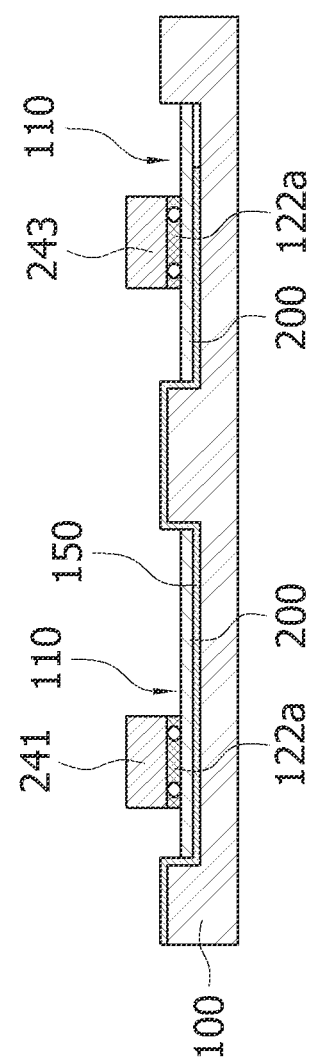

Next, as shown in FIG. 7D, before applying a first adhesive 121a to the mounting groove 110, underfill a second adhesive 122a on a region where the electronic component 240 is mounted, that is, on a soldering region, and cure it to form a second adhesive layer 122.

Here, the soldering region includes an empty space between the circuit board 200 and the electronic component 240, and the second adhesive 122a is filled in the empty space by an underfill process and cured. Accordingly, the electronic component 240 may be firmly fixed to the circuit board 200, and peeling of the electronic component 240 caused by the sensor mounted wafer warpage phenomenon of the wafer may be prevented.

Figure 7E:
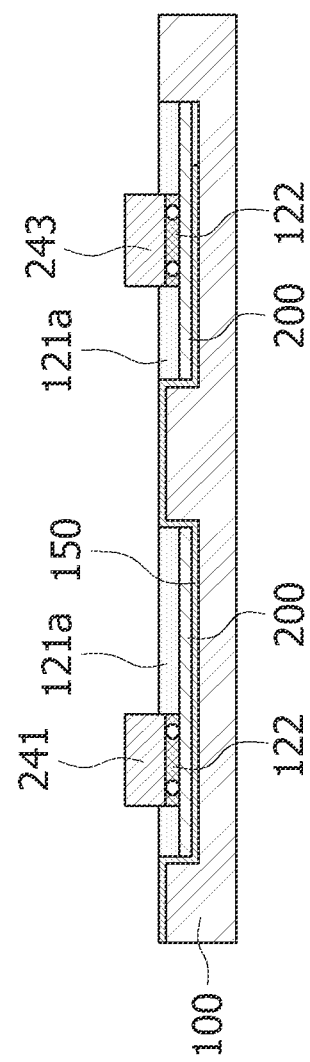

Next, as shown in FIG. 7E, the first adhesive 121a including a thermally conductive material is applied to the mounting groove 110 in which the circuit board 200 is mounted, and then cured. Here, the thermally conductive material may be a non-conductive material to prevent a short of the electronic component.

Meanwhile, referring to FIG. 7C, due to the form of arrangement of the first metal layer 150, there may be a gap between the lower case 100 and the circuit board 200, and the first adhesive 121a may be flowed into this gap region and cured, thereby filling the gap region.

Next, as shown in FIG. 7F, an insertion groove 310 is formed in a shape corresponding to the electronic component 240 on one surface of an upper case 300. Here, the insertion groove 310 may be formed by a wet etching technique.

Next, as shown in FIG. 7G, a second metal layer 350 is formed on one surface of the upper case 300 in which the insertion groove 310 is formed. Here, the second metal layer 350 may be deposited on one surface of the upper case 300 by various deposition techniques.

In addition, the second metal layer 350 may be made of a metal material having relatively excellent thermal conductivity, such as titanium (Ti) and copper (Cu), but is not limited thereto.

For example, the second metal layer 350 may be placed in a stacked structure of titanium (Ti), copper (Cu), and titanium (Ti), in which case the thickness of titanium (Ti) may be formed to 500 Å and the thickness of copper (Cu) may be formed to 10000 to 20000 Å.

As such, the second metal layer 350 may be placed on a region other than a region where the antenna board 210 is placed. That is, the second metal layer 350 may be formed in a symmetrical shape with the first metal layer 150 when the lower case 100 and the upper case 300 are bonded together.

Alternatively, only one of the first metal layer 150 and the second metal layer 350 may be formed on one surface of the lower case 100 or the upper case 300.

Meanwhile, the above-described mounting the electronic component 240 on the above-described circuit board 200, forming the mounting groove 110 and the first metal layer 150 in the lower case 100, and forming the insertion groove 310 and the second metal layer 350 in the upper case 300 may be individually formed regardless of the order.

Figure 7H:
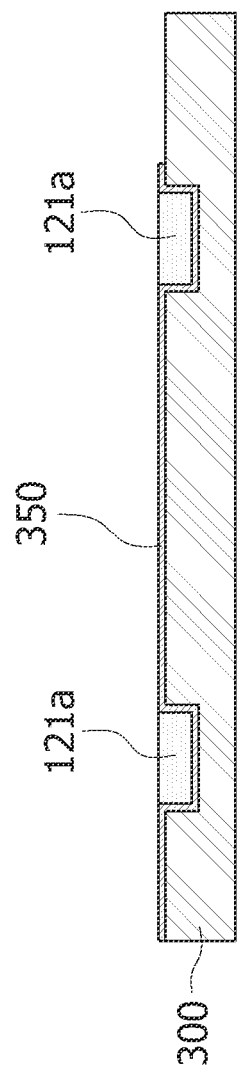
Figure 7I:
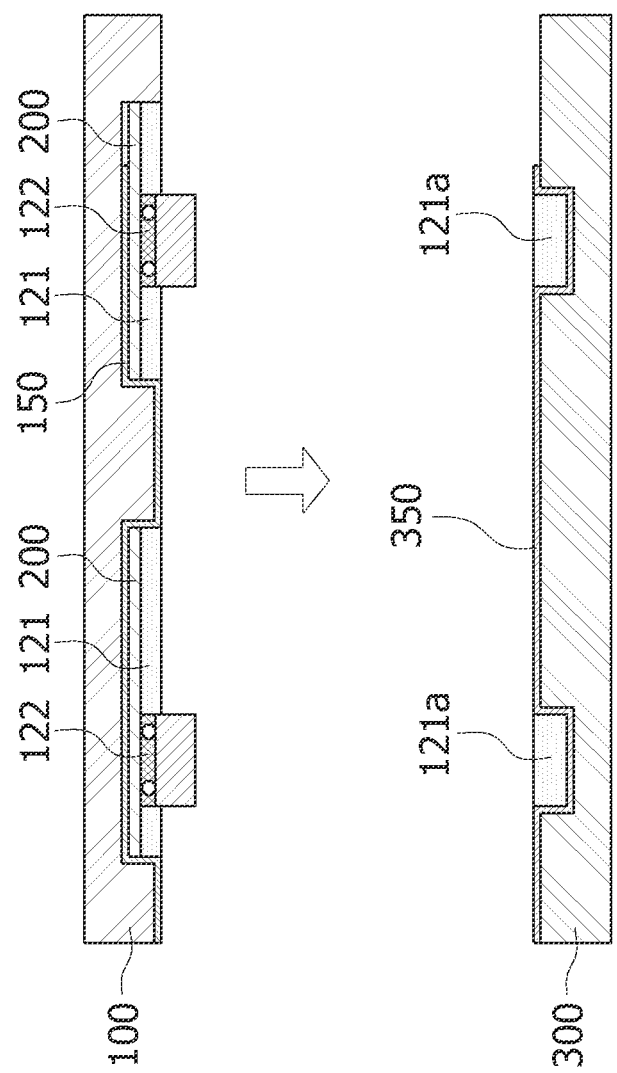
Figure 7J:
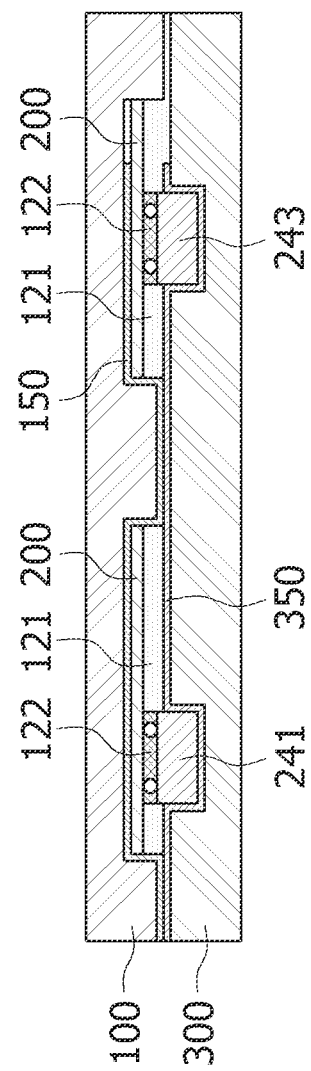

Next, as shown in FIGS. 7H to 7J, the first adhesive 121a is applied to the insertion groove 310 formed in the upper case 300; and the lower case 100 and the upper case 300 are bonded together so that the electronic component 240 is inserted into the insertion groove 310 before the first adhesive 121a is cured.

Here, as shown in FIG. 7I, the lower case 100 and the upper case 300 are bonded together so that the insertion groove 310 of the upper case 300 faces upward and the mounting groove 110 of the lower case 100 faces downward. This is to prevent that if bonding is performed with the insertion groove 310 of the upper case 300 facing downward, the first adhesive 121a that has not yet been cured flows down by gravity in the bonding process.

Meanwhile, due to the form of arrangement of the second metal layer 350, there may be a gap between the lower case 100 and the upper case 300, and the first adhesive 121a may be flowed into this gap region and cured, thereby filling the gap region.

In the above-described bonding process, the first adhesive 121a applied to the insertion groove 310 spreads to the bonding surface of the lower case 100 and the upper case 300 due to the electronic component 240, and when the first adhesive 121a spread on the bonding surface is cured, the lower case 100 and the upper case 300 are bonded together and the first adhesive layer 121 is formed to surround the electronic component 240.

As described above, the first adhesive layer 121 is placed in a shape completely filled in the mounting groove 110 and the insertion groove 310 to surround the electronic component 240, and as the first adhesive layer 121 includes a thermally conductive material it is possible to precisely sense the temperature inside the chamber in which the sensor mounted wafer is loaded or the temperature of the sensor mounted wafer loaded in the chamber.

The first adhesive 121a is characterized in that it is applied and cured in a shape completely filled in the mounting groove 110 and the insertion groove 310 to surround the electronic component so that pores are not included inside the mounting groove 110 and the insertion groove 310 with the lower case 100 and the upper case 300 bonded together.

As described above, the method of manufacturing the sensor mounted wafer according to the first embodiment of the present invention may prevent the sensor mounted wafer warpage phenomenon caused by pore expansion due to temperature rise by forming the first adhesive layer 121 so that pores are not included inside.

In addition, the first adhesive 121a is characterized in that its thermal expansion coefficient is smaller than or the same as those of the lower case 100 and the upper case 300.

As described above, the method of manufacturing the sensor mounted wafer according to the first embodiment of the present invention may prevent the sensor mounted wafer warpage phenomenon caused by expansion of the first adhesive layer 121 due to temperature rise by forming the first adhesive layer 121 using the first adhesive 121a having a relatively low thermal expansion coefficient.

In addition, the method of manufacturing the sensor mounted wafer according to the first embodiment of the present invention may effectively disperse heats by respectively placing the first metal layer 150 and the second metal layer 350 on one surface on which the lower case 100 and the upper case 300 are bonded together, thereby effectively reducing a temperature deviation of each sensor 241 for each location, which allows to precisely sense the temperature inside the chamber or the temperature of the sensor mounted wafer loaded in the chamber for each location.

In addition, the method of manufacturing the sensor mounted wafer according to the first embodiment of the present invention may protect the electronic component 240, since the first and second metal layers 150 and 350 surround the electronic component 240, thereby shielding electromagnetic interference (EMI).

In addition, the method of manufacturing the sensor mounted wafer according to the first embodiment of the present invention may prevent communication disturbance or charging disturbance caused by the first and second metal layers 150 and 350 made of metal material by not placing the first and second metal layers 150 and 350 on a region where the antenna board 210 is placed.

Figure 8:
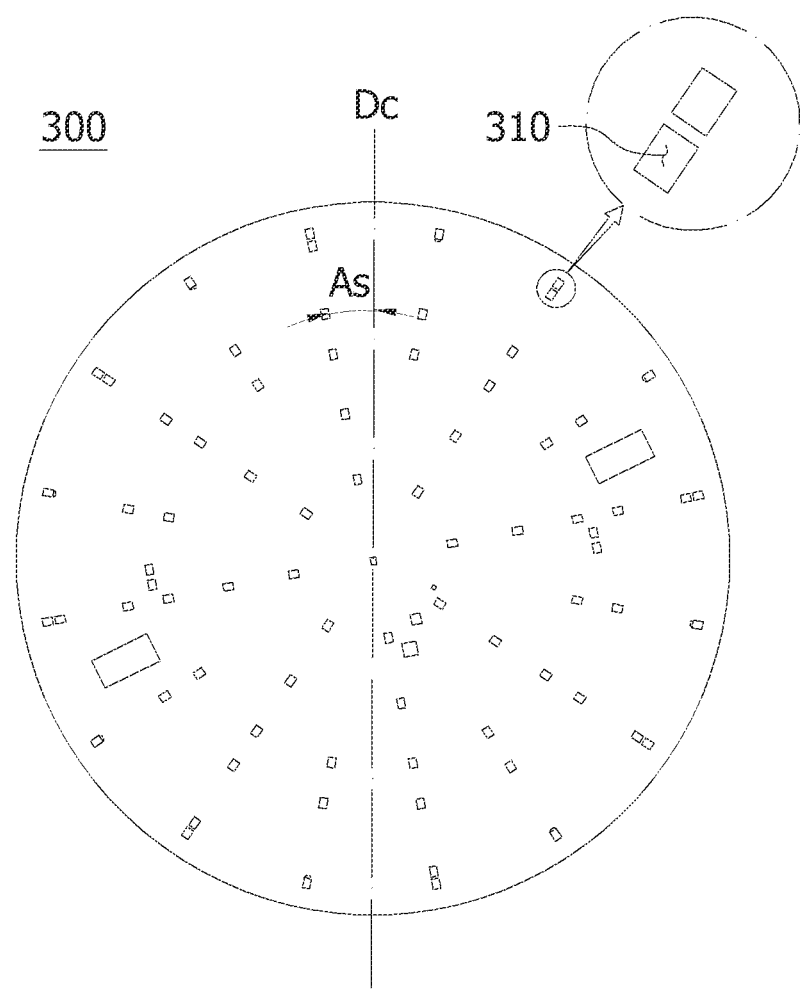
FIG. 8 is a top plan view of a lower case of a sensor mounted wafer according to a second embodiment of the present invention.
Figure 9:
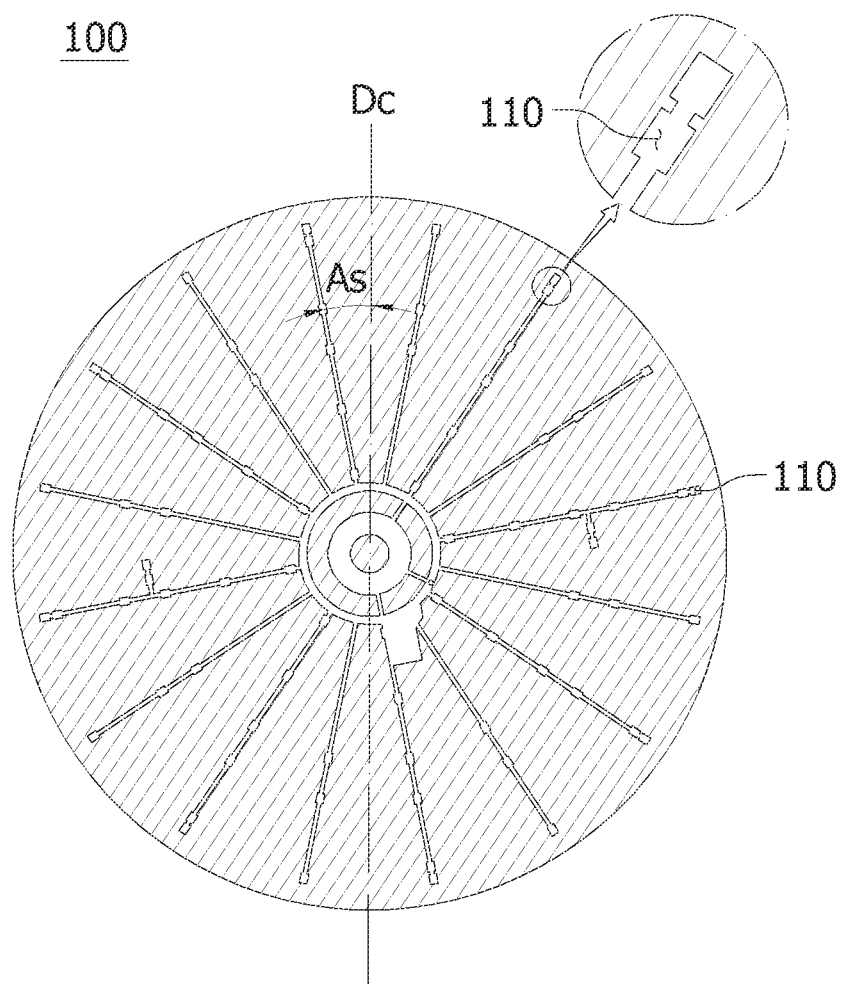
FIG. 9 is a top plan view of an upper case of the sensor mounted wafer according to the second embodiment of the present invention.

FIG. 8 is a top plan view of a lower case of a sensor mounted wafer according to a second embodiment of the present invention; FIG. 9 is a top plan view of an upper case of the sensor mounted wafer according to the second embodiment of the present invention; and FIG. 10 is a view illustrating a circuit board mounted on the lower case of FIG. 8.

Meanwhile, a lower case 100 and an upper case 300 may be formed by growing molten silicon (Si) in a specific crystal direction, in which case, the lower case 100 and the upper case 300 may have a structure vulnerable to breakage due to this specific crystal direction.

In particular, if a mounting groove 110 and an insertion groove 310 are formed along the crystal direction of the lower case 100 and the upper case 300, products are highly likely to be damaged in a process of manufacturing the sensor mounted wafer according to the second embodiment of the present invention is manufactured.

Figure 10:
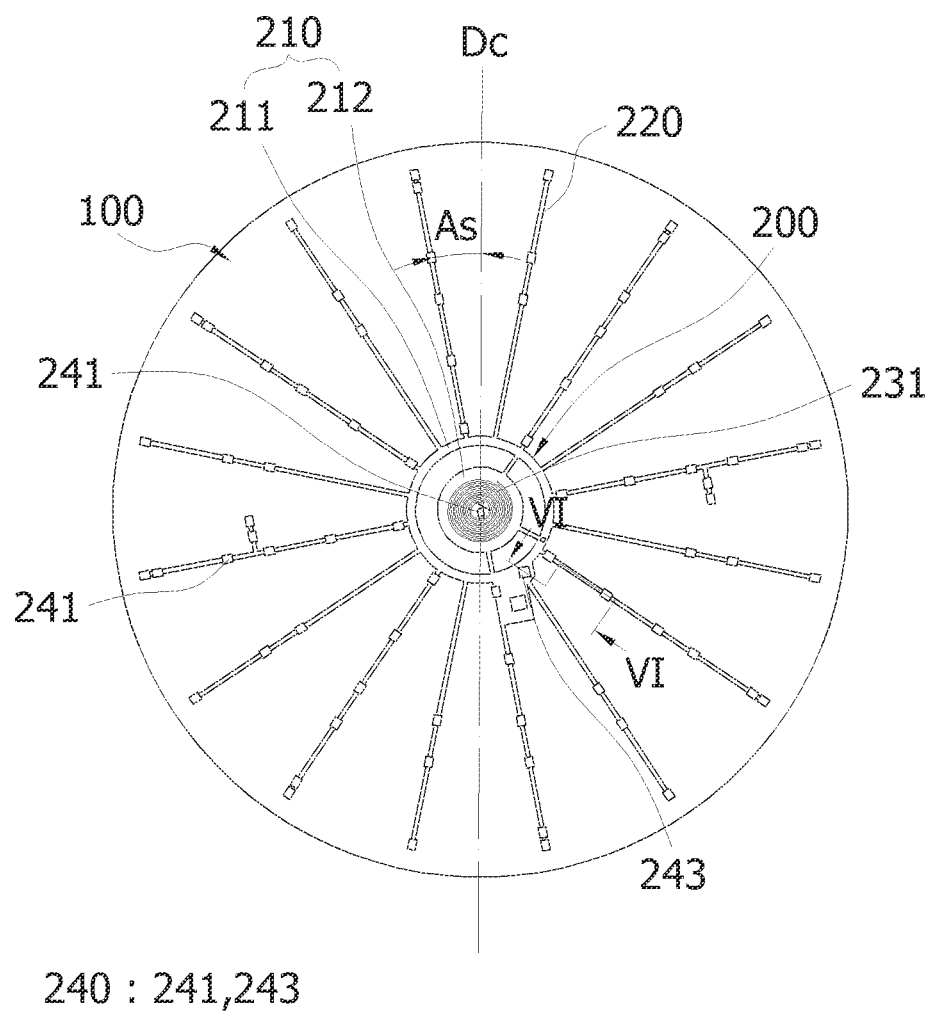
FIG. 10 is a view illustrating a circuit board mounted on the lower case of FIG. 8.

In order to solve such a problem, as shown in FIGS. 8 to 10, the sensor mounted wafer according to the second embodiment of the present invention forms the mounting groove 110 and the insertion groove 310 corresponding to a plurality of sensor boards 220 at a regular distance so that they are formed to deviate from a crystal direction Dc of the lower case 100 or the upper case 300 by a set angle As. Here, the set angle As may have a constant value regardless of the number of sensor boards 220, and in particular, it is preferable to be 11.25°.

The distance Ad between the plurality of sensor boards 220 may be calculated by Equation 1 below:

$$Ad = \frac{360°}{m} \qquad \text{[Equation 1]}$$

Here, m is the number of sensor boards 220 and is an even number.

For example, as shown in the drawing, when the number of sensor boards 220 is 16, each of the sensor boards 220 may be arranged at 22.5° distances. And the mounting groove 110 and the insertion groove 310 in which each sensor board 220 is placed may be formed to deviate from the crystal direction Dc of the lower case 100 or the upper case 300 at 11.25°.

Through this, the sensor mounted wafer according to an embodiment of the present invention may not only significantly lower the damage rate of a product, but also improve product quality.

Figure 11:
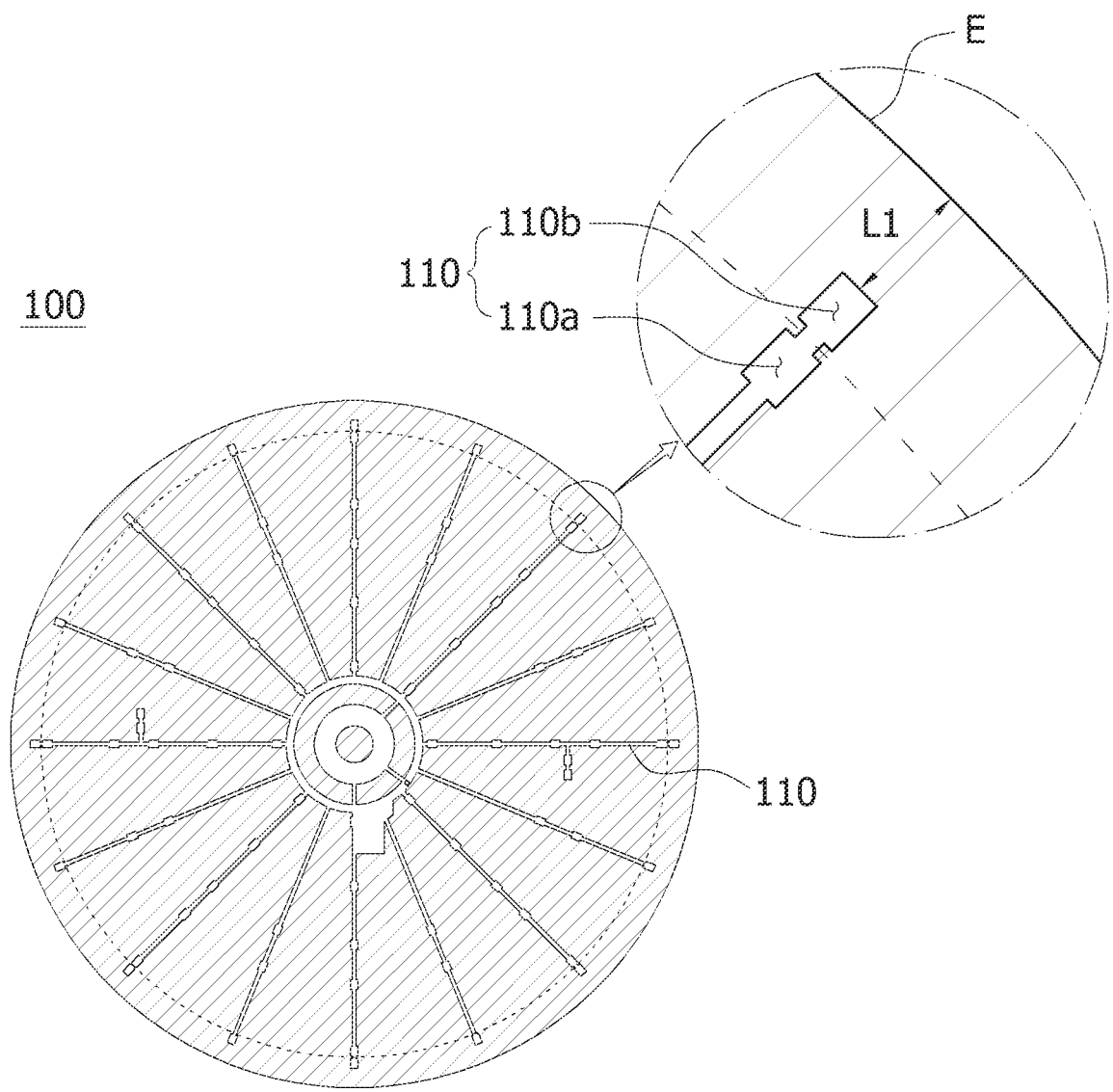
FIG. 11 is a top plan view of a lower case of a sensor mounted wafer according to a third embodiment of the present invention.
Figure 12:
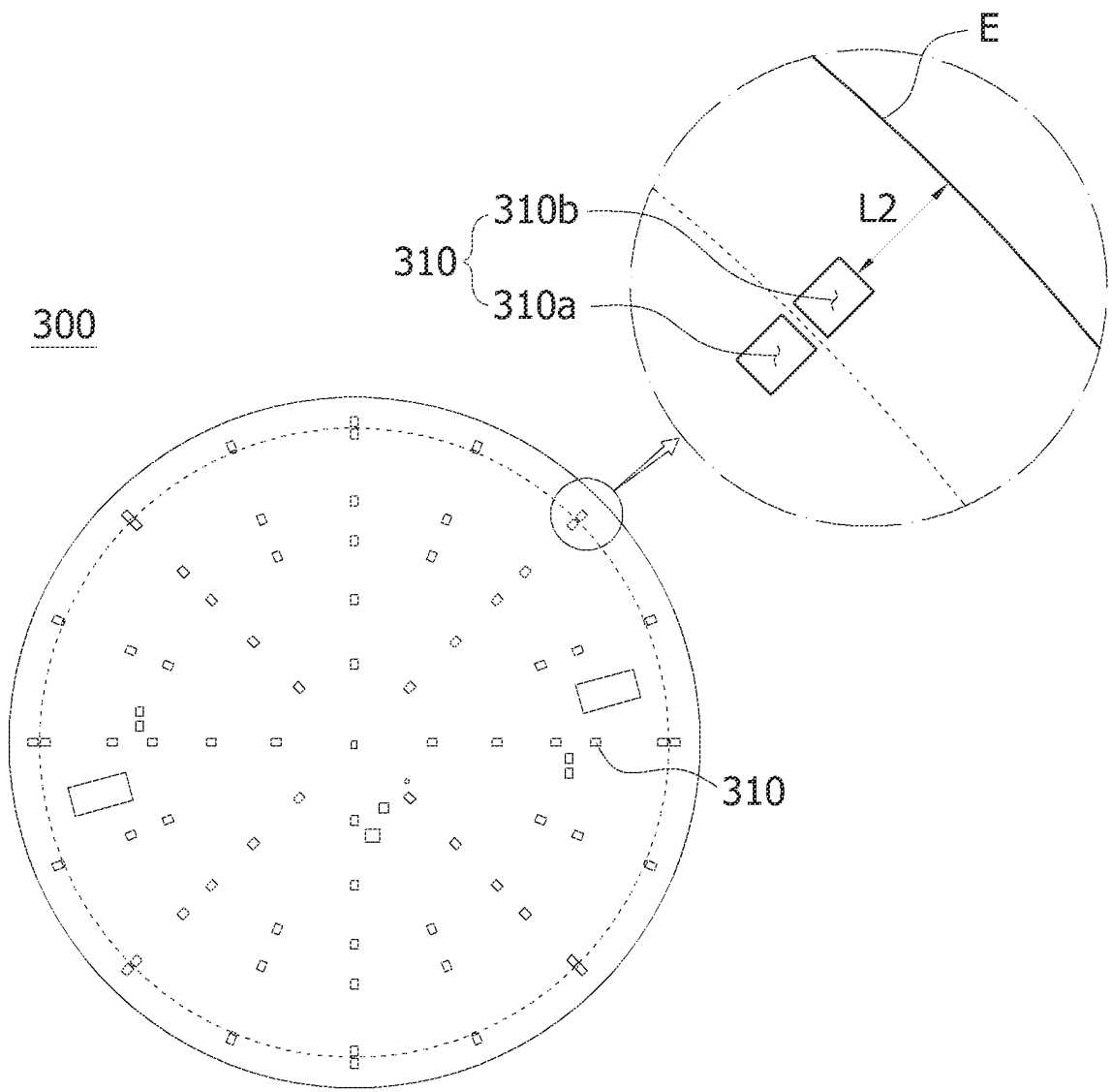
FIG. 12 is a top plan view of an upper case of the sensor mounted wafer according to the third embodiment of the present invention.

FIG. 11 is a top plan view of a lower case of a sensor mounted wafer according to a third embodiment of the present invention; FIG. 12 is a top plan view of an upper case of the sensor mounted wafer according to the third embodiment of the present invention; and FIG. 13 is a view illustrating a circuit board mounted on the lower case of FIG. 11.

Figure 13:
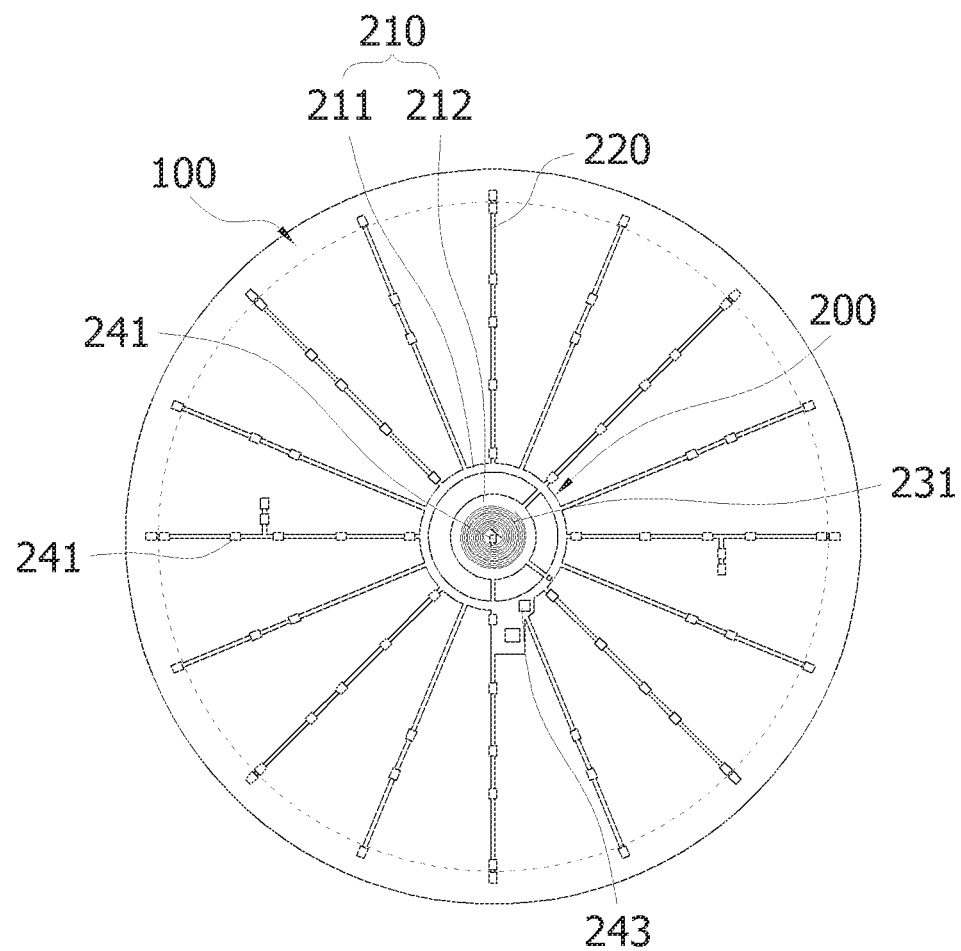
FIG. 13 is a view illustrating a circuit board mounted on the lower case of FIG. 11.

Referring to FIGS. 11 and 13, on a lower case 100, a mounting groove 110 in which a circuit board 200 is mounted is formed in a shape corresponding to the circuit board 200. Here, the mounting groove 110 may be divided into a main mounting groove 110a and an edge mounting groove 110b.

Specifically, the main mounting grooves 110a may be formed in a shape corresponding to the lower surface of a concentric antenna board 210, in a shape corresponding to the lower surface of a radial sensor board 220, and in a shape corresponding to the lower surface of a control board 250, respectively. In addition, the edge mounting groove 110b may be formed to extend outwardly from the main mounting groove 110a. That is, the edge mounting groove 110b refers to a groove extending from each end of the main mounting grooves 110a having a shape corresponding to the lower surface of the radial sensor board 220.

Referring to FIGS. 12 and 13, in the upper case 300, an insertion groove 310 into which an electronic component 240 is inserted is formed in a shape corresponding to the electronic component 240. Here, the insertion groove 310 may be divided into a main insertion groove 310a and an edge insertion groove 310b.

Specifically, the main insertion groove 310a faces the main mounting groove 110a of the lower case 100 and is formed at a position corresponding to the electronic component 240 mounted on the circuit board 200. In addition, the main insertion groove 310b faces the edge mounting groove 110b of the lower case 100 and is formed at a position corresponding to the electronic component 240 mounted on the circuit board 200.

Here, referring to FIGS. 11 and 12, the distance between the edge mounting groove 110b and the edge E of the lower case 100 may be less than or equal to a first set length L1, and the distance between the edge insertion groove 310b and the edge E of the upper case 300 may be less than or equal to a second set length L2. For example, the first set length L1 and the second set length L2 may be the same length as 1 to 3.5 mm, but are not limited thereto.

In this way, the edge mounting groove 110b and the edge insertion groove 310b are formed relatively close to the edges E of the lower case 100 and the upper case 300, and the edge mounting groove 110b and the edge insertion groove 310b have sensors 241 therein, thereby capable of sensing relatively accurately the temperature or pressure of the edge region of the sensor mounted wafer.

Meanwhile, since the edge mounting groove 110b and the edge insertion groove 310b are relatively close to the edges E of the lower case 100 and the upper case 300, it is difficult to form them by an etching process.

Accordingly, the sensor mounted wafer according to an embodiment of the present invention forms the main mounting groove 110a and the edge mounting groove 110b using different processes, and forms the main insertion groove 310a and the edge insertion groove 310b using different processes.

Specifically, the main mounting groove 110a and the main insertion groove 310a may be formed by an etching process, for example, a wet etching process, and the edge mounting groove 110b and the edge insertion groove 310b may be formed by a laser drilling process. Here, the laser drilling process may use an ultrahigh frequency pulse laser or an Ultraviolet (UV) laser, but is not limited thereto.

In addition, the edge mounting groove 110b and the edge insertion groove 310b may be formed after the main mounting groove 110a and the main insertion groove 310a are formed.

Figure 14:
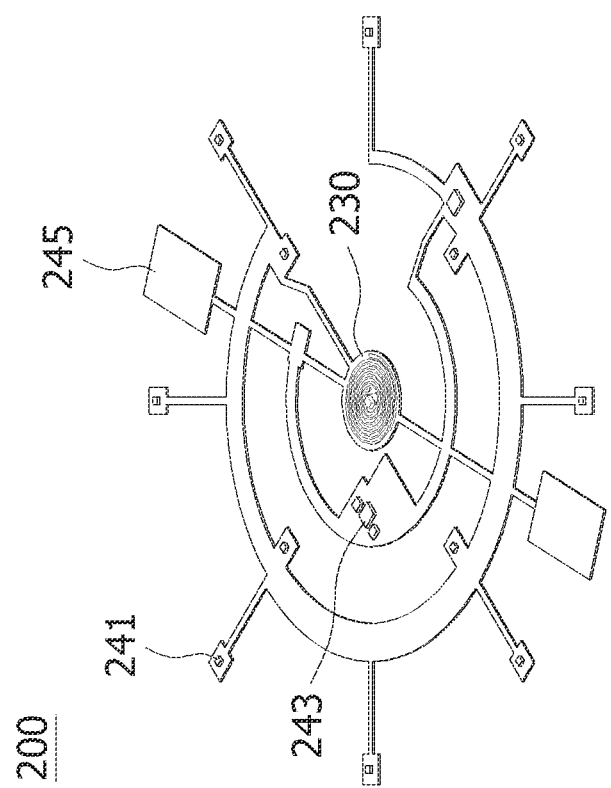
FIG. 14 is a perspective view of a circuit board included in a sensor mounted wafer according to a fourth embodiment of the present invention.
Figure 15:
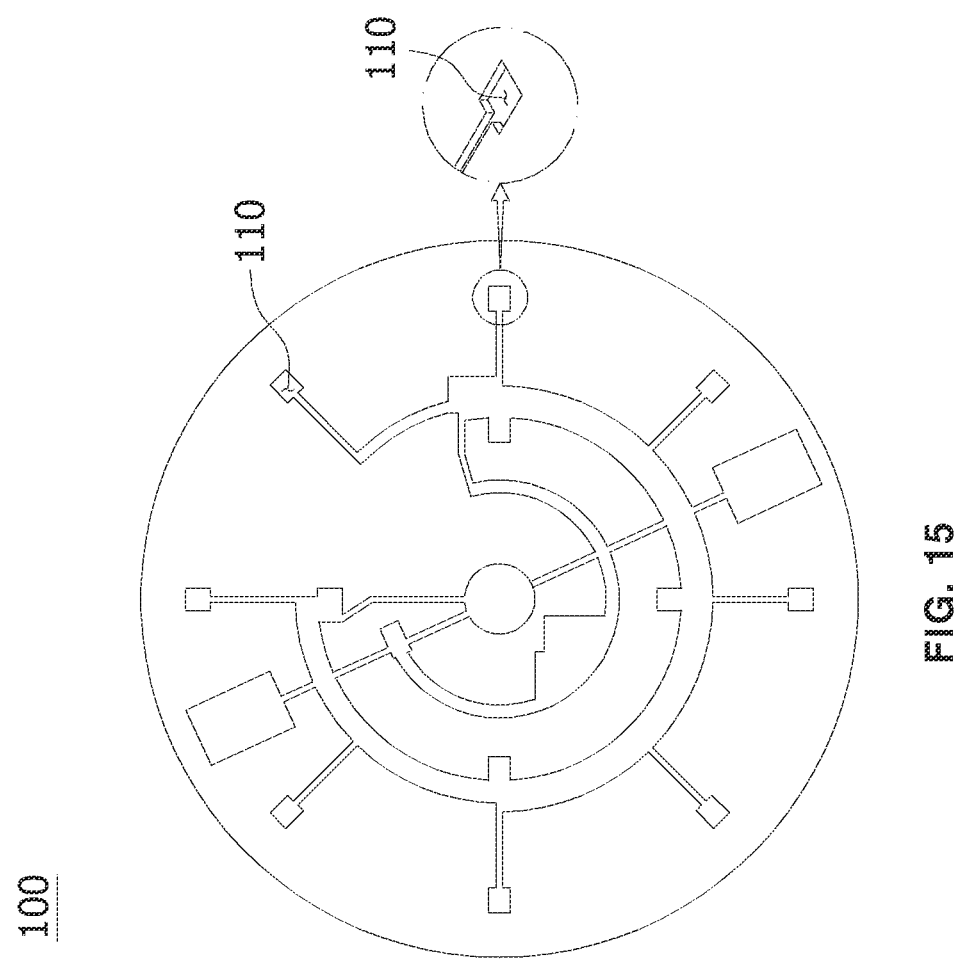
FIG. 15 is a top plan view of a lower case of the sensor mounted wafer according to the fourth embodiment of the present invention.
Figure 16:
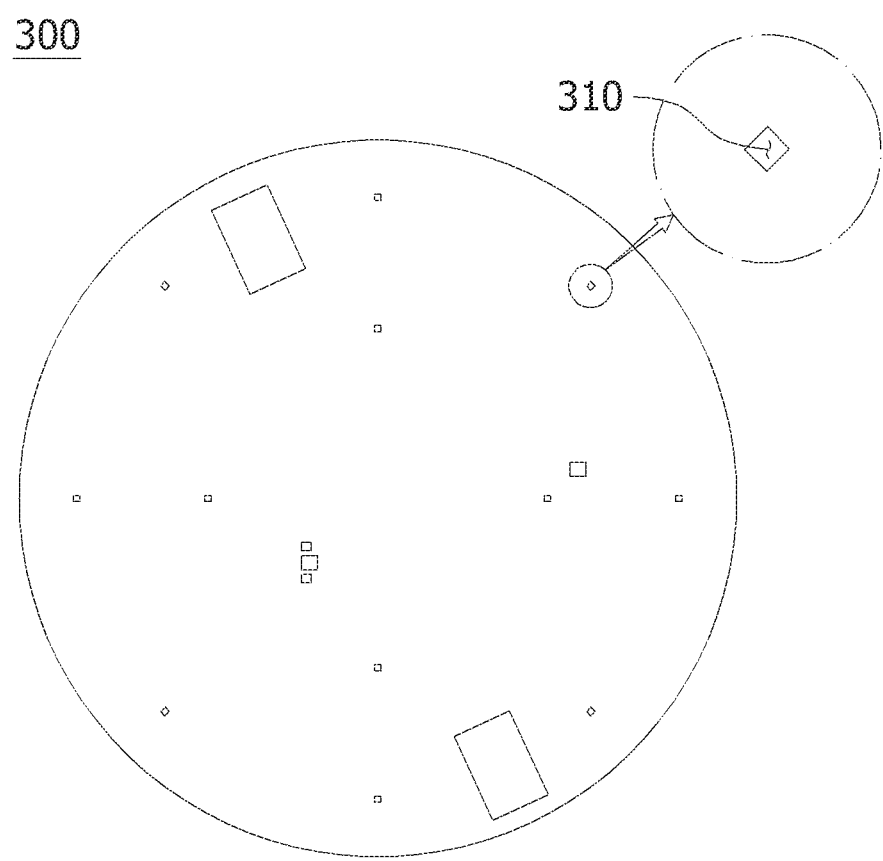
FIG. 16 is a top plan view of an upper case of the sensor mounted wafer according to the fourth embodiment of the present invention.
Figure 17:
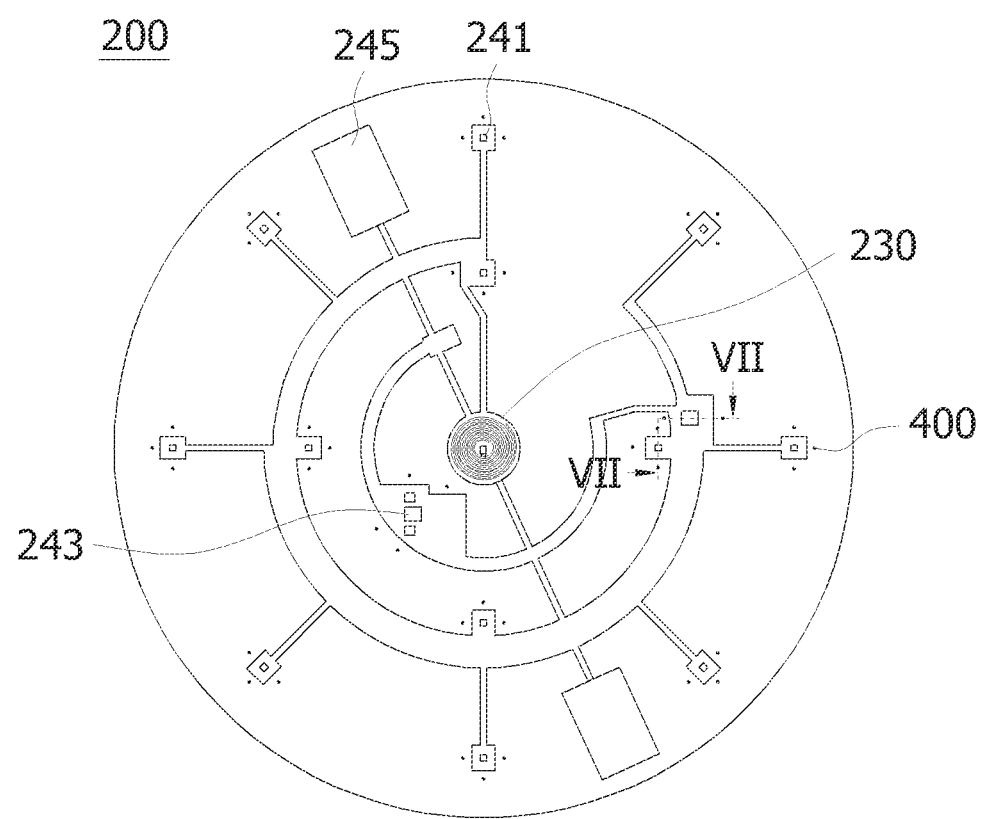
FIG. 17 is a view illustrating a circuit board mounted on the lower case of FIG. 15.

FIG. 14 is a perspective view of a circuit board included in a sensor mounted wafer according to a fourth embodiment of the present invention; FIG. 15 is a top plan view of a lower case of the sensor mounted wafer according to the fourth embodiment of the present invention; FIG. 16 is a top plan view of an upper case of the sensor mounted wafer according to the fourth embodiment of the present invention; and FIG. 17 is a view illustrating a circuit board mounted on the lower case of FIG. 15.

Referring to FIGS. 14 to 17, a sensor mounted wafer according to a fourth embodiment of the present invention is characterized in that the sensor 241 is a plasma sensor 241. Here, the plasma sensor 241 is provided in plural and embedded in a predetermined sensing position of the sensor mounted wafer to perform sensing for monitoring semiconductor process at the corresponding position.

Such plasma sensor 241 may sense the density and uniformity of plasma in a semiconductor process environment.

Meanwhile, plasma refers to a gaseous state in which negative and positive charges are separated at an ultra-high temperature, and when a plasma sensor device is exposed to plasma during plasma sensing, charges of opposite polarities are electrified on the surfaces and inner surfaces of a lower case 100 and an upper case 300. Accordingly, when the plasma sensor 241 senses the plasma, the accuracy is deteriorated and an IC chip 243 malfunctions.

In order to solve such a problem, the plasma sensor mounted wafer according to the fourth embodiment of the present invention includes a conductive pattern 400 on the bonding surface of the lower case 100 and the upper case 300 to form an equipotential surface between the lower case 100 and the upper case 300.

Specifically, referring to FIG. 17, the conductive pattern 400 may be placed on one surface of the lower case 100 on which a mounting groove 110 is not formed. Here, since the above-described problem mainly occurs in an electronic component 240 such as the plasma sensor 241 and the IC chip 243, the conductive pattern 400 is preferably placed around the electronic component 240.

In addition, the conductive pattern 400 may be made of silver (Ag) dots formed through silver (Ag) paste, but is not limited thereto and may be made of various conductive materials formed by various forming methods.

Meanwhile, since the conductive pattern 400 is placed on the bonding surface of the lower case 100 and the upper case 300 to form an equipotential surface between the lower case 100 and the upper case 300; unlike FIG. 17, it may be placed on one surface of the upper case 300 on which an insertion groove 310 is not formed.

As described above, the sensor mounted wafer according to the fourth embodiment of the present invention may place the conductive pattern 400 on bonding surface of the lower case 100 and the upper case 300 to form an equipotential surface between the lower case 100 and the upper case 300, thereby allowing the plasma sensor 241 to accurately sense the density and uniformity of the plasma and preventing malfunction of the IC chip 243.

Figure 18:
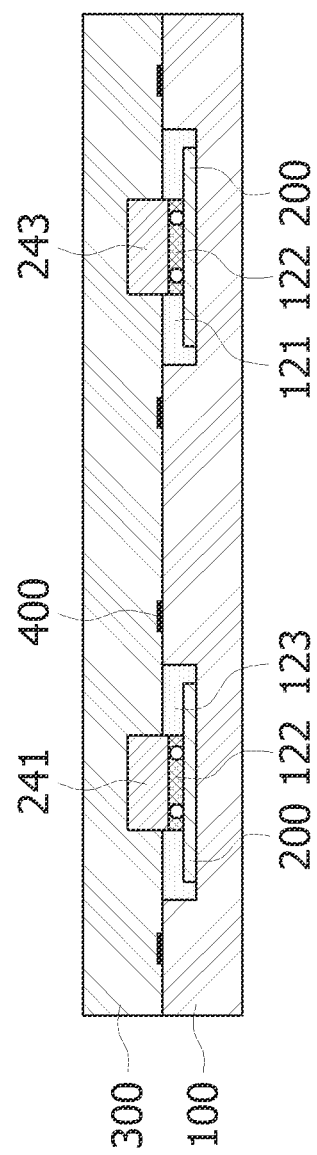
FIG. 18 is a cross-sectional view of the sensor mounted wafer according to the fourth embodiment of the present invention, taken along VII-VII line of FIG. 17.

FIG. 18 is a cross-sectional view of the sensor mounted wafer according to the fourth embodiment of the present invention, taken along VII-VII line of FIG. 17.

Referring to FIG. 18, the plasma sensor mounted wafer according to an embodiment of the present invention may include a lower case 100, a circuit board 200, an upper case 300, and adhesive layers 121 to 123.

The lower case 100 has a mounting groove 110 formed on one surface thereof. Further, the circuit board 200 mounts an electronic component 240 such as a plasma sensor 241 and a IC chip 243, and is mounted in the mounting groove 110 of the lower case 100. Here, the plasma sensor 241 and the IC chip 243 may be soldered to wiring provided on the circuit board 200, and the circuit board 200 may be attached to the mounting groove 110 of the lower case 100 using an adhesive.

The upper case 300 has an insertion groove 310 formed on one surface thereof into which the plasma sensor 241 and the IC chip 243 are inserted.

A conductive pattern 400 is placed on any one surface of the lower case 100 or the upper case 300. In particular, the conductive pattern 400 is preferably placed around the plasma sensor 241 and the IC chip 243.

A first adhesive layer 123 is placed inside the mounting groove 110 in which the plasma sensor 241 is mounted, and a second adhesive layer 121 is placed inside the mounting groove 110 in which the IC chip 243 is mounted. In particular, the first adhesive layer 123 is made of heat dissipating silicon and serves to protect the plasma sensor 241 from high temperature heat.

In addition, the first adhesive layer 123 is placed to surround the plasma sensor 241, and the second adhesive layer 121 is placed to surround the IC chip 243.

The upper case 300 is bonded together to the lower case 100 so that the upper portion of the plasma sensor 241 and the IC chip 243 is inserted into the insertion groove 310.

In this way, when the lower case 100 and the upper case 300 are bonded together, the conductive pattern 400 is placed on the bonding surface. Accordingly, an equipotential surface between the lower case 100 and the upper case 300 is formed, thereby allowing the plasma sensor 241 to accurately sense the density and uniformity of the plasma and preventing malfunction of the IC chip 243.

While this invention has been described in connection with what is presently considered to be practical exemplary embodiments, it will be apparent to those of ordinary skill in the art that the described embodiments may be embodied in various modified forms within the scope which does not depart from the essential characteristics of the present invention.

The embodiments of the present invention disclosed in the present specification and drawings are only provided for specific examples to easily describe the technical content of the present invention and to aid understanding of the present invention, and are not intended to limit the scope of the present invention. Therefore, the scope of the present invention should be construed that all changes or modifications derived based on the technical idea of the present invention in addition to the embodiments disclosed herein are included in the scope of the present invention.

This work was supported by Korea Evaluation Institute of Industrial Technology grant funded by the Ministry of Trade, Industry and Energy (MOTIE, Republic of Korea)(No. 10077629).

What is claimed is:

1. A sensor mounted wafer, comprising:
   a lower case having a mounting groove formed on a surface of the lower case;
   a circuit board on which, wherein an electronic component is mounted on the circuit board, and the circuit board is placed in the mounting groove;
   an upper case having an insertion groove on a surface of the upper case, wherein the electronic component is inserted into the insertion groove, and the upper case is bonded together to the lower case; and
   a metal layer placed on at least one surface of the lower case and the upper case, the metal layer comprises a first metal layer placed between the lower case and the circuit board and a second metal layer placed between the circuit board and the upper case, and the first metal layer and the second metal layer surround the electronic component,
   wherein the circuit board comprises an antenna board and a plurality of sensor boards, wherein the antenna board has a concentric circle shape and the plurality of sensor boards extend from an outer circle of the antenna board to an outside and the plurality of sensor boards are arranged radially, and
   wherein a charging antenna is provided in a coil shape on an inner circle of the antenna board, a communication antenna is provided in the coil shape on an outer circle of the antenna board, and a plurality of sensors are provided on the plurality of sensor boards.

2. The sensor mounted wafer of claim 1, wherein materials of the lower case and the upper case comprise silicon (Si) and gallium arsenide (GaAs).

3. The sensor mounted wafer of claim 1, further comprising:
   an adhesive layer comprising a thermally conductive material and the adhesive layer is placed inside the mounting groove and the insertion groove.

4. The sensor mounted wafer of claim 1, wherein the electronical component comprises at least one of an integrated circuit (IC) chip and a battery.

5. The sensor mounted wafer of claim 3, wherein the adhesive layer has a thermal expansion coefficient smaller than or equal to a thermal expansion coefficient of the lower case and a thermal expansion coefficient of the upper case.

6. The sensor mounted wafer of claim 3, wherein the adhesive layer is placed in a shape to surround the electronic component.

7. The sensor mounted wafer of claim 1, wherein a lower portion of the electronic component is located inside the mounting groove and an upper portion of the electronic component is located inside the insertion groove.

8. The sensor mounted wafer of claim 1, wherein the mounting groove is formed in a shape corresponding to the circuit board and the insertion groove is formed in a shape corresponding to the electronic component.

9. A sensor mounted wafer, comprising:
   a lower case having a mounting groove formed on a surface of the lower case;
   a circuit board on which, wherein an electronic component is mounted on the circuit board, and the circuit board is placed in the mounting groove;
   an upper case having an insertion groove on a surface of the upper case, wherein the electronic component is inserted into the insertion groove, and the upper case is bonded together to the lower case; and
   a metal layer placed on at least one surface of the lower case and the upper case, the metal layer comprises a first metal layer placed between the lower case and the circuit board and a second metal layer placed between the circuit board and the upper case, and the first metal layer and the second metal layer surround the electronic component,
   wherein the circuit board comprises an antenna board and a plurality of sensor boards, wherein the antenna board has a concentric circle shape and the plurality of sensor boards extend from an outer circle of the antenna board to an outside and the plurality of sensor boards are arranged radially, and
   wherein the metal layer is placed on a region other than a region where the antenna board is placed, and the metal layer is electrically disconnected from the electronic component.

* * * * *